US009436388B2

United States Patent
Jenkins et al.

(10) Patent No.: US 9,436,388 B2
(45) Date of Patent: Sep. 6, 2016

(54) MEMORY ACCESS ALIGNMENT IN A DOUBLE DATA RATE ('DDR') SYSTEM

(71) Applicant: International Business Machines Corporation, Armonk, NY (US)

(72) Inventors: Steven K. Jenkins, Raleigh, NC (US); Robert B. Likovich, Jr., Wake Forest, NC (US); Michael R. Trombley, Cary, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/093,063

(22) Filed: Apr. 7, 2016

(65) Prior Publication Data

US 2016/0216897 A1 Jul. 28, 2016

Related U.S. Application Data

(60) Continuation of application No. 14/482,711, filed on Sep. 10, 2014, now Pat. No. 9,343,123, which is a continuation of application No. 14/011,030, filed on Aug. 27, 2013, now Pat. No. 8,902,683, which is a division of application No. 13/171,811, filed on Jun. 29, 2011, now Pat. No. 8,547,760.

(51) Int. Cl.
*G11C 7/00* (2006.01)
*G06F 3/06* (2006.01)
*G11C 7/10* (2006.01)

(52) U.S. Cl.
CPC ........... *G06F 3/0605* (2013.01); *G06F 3/0659* (2013.01); *G06F 3/0673* (2013.01); *G11C 7/1072* (2013.01)

(58) Field of Classification Search
CPC .................. G11C 8/18; G11C 7/00

USPC ......................... 365/189.011–225.7
See application file for complete search history.

(56) References Cited

U.S. PATENT DOCUMENTS

| | | | |
|---|---|---|---|
| 7,594,055 B2 * | 9/2009 | Gower | G06F 13/4247 710/305 |
| 7,921,243 B1 * | 4/2011 | White | G06F 3/0613 710/100 |
| 2007/0276976 A1 * | 11/2007 | Gower | G06F 13/4243 710/305 |
| 2009/0164672 A1 * | 6/2009 | Bandholz | G06F 13/28 710/22 |
| 2013/0003475 A1 | 1/2013 | Jenkins et al. | |
| 2013/0346686 A1 | 12/2013 | Jenkins et al. | |
| 2014/0379979 A1 | 12/2014 | Jenkins et al. | |

OTHER PUBLICATIONS

Appendix P; List of IBM Patent or Applications Treated as Related, May 24, 2016, 2 pages.

* cited by examiner

*Primary Examiner* — Harry W Byrne
(74) *Attorney, Agent, or Firm* — Brandon C. Kennedy; Steven Meyers; Kennedy Lenart Spraggins LLP

(57) ABSTRACT

Memory access alignment in a double data rate ('DDR') system, including: executing, by a memory controller, one or more write operations to a predetermined address of a DDR memory module, including sending to the DDR memory module a predetermined amount of data of a predetermined pattern along with a data strobe signal; executing, by the memory controller, a plurality of read operations from the predetermined address of the DDR memory module, including capturing data transmitted from the DDR memory module; and determining, by the memory controller, a read adjust value and a write adjust value in dependence upon the data captured in response to the read operations.

11 Claims, 7 Drawing Sheets

MEMORY ACCESS ALIGNMENT IN A DOUBLE DATA RATE ('DDR') SYSTEM

CROSS-REFERENCE TO RELATED APPLICATIONS

The present application is a continuation application and claims priority from U.S. patent application Ser. No. 14/482,711, filed Sep. 10, 2014, which is a continuation application and claims priority from U.S. Pat. No. 8,902,683, issued Dec. 2, 2014, which is a divisional application and claims priority from U.S. Pat. No. 8,547,760, issued Oct. 1, 2013. Each patent application cited herein is hereby incorporated by reference in its entirety.

BACKGROUND

1. Field of the Invention

The field of the invention is data processing, or, more specifically, methods, apparatus, and products for memory access alignment in a double data rate ('DDR') system.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

In a DDR system, DRAMs send a strobe ('DQS') coincident with multiple beats of data ('DQ'). On reads, the memory controller chip is responsible for delaying the DQS to capture the DQ bits while meeting the setup and hold requirements at the capturing latches. On writes, the memory controller chip is responsible for delaying the DQS to be ideally centered within the DQ "eye" to ensure proper capture into the memory device. Before a DRAM device is used to store actual application data, the memory controller runs a training sequence where DQS and DQ arrival times at both the DRAM and memory controller are measured against reference clocks. These measurements are then used to adjust DQS and DQ delays to meet setup and hold times. As DRAM speeds increase, the likelihood of crossing a clock edge gets higher so the need to ensure alignment to the correct clock edge becomes greater.

SUMMARY

Methods, apparatus, and products for memory access alignment in a double data rate ('DDR') system, including: executing, by a memory controller, one or more write operations to a predetermined address of a DDR memory module, including: signaling the DDR memory module of the one or more write operations; and sending to the DDR memory module a predetermined amount of data of a predetermined pattern along with a data strobe signal; executing, by the memory controller, a plurality of read operations from the predetermined address of the DDR memory module, including: signaling the DDR memory module of the read operations; capturing data transmitted from the DDR memory module; and determining, by the memory controller, a read adjust value and a write adjust value in dependence upon the data captured in response to the read operations, wherein the read adjust value is a number of cycles between signaling the read operations and capturing a specific portion of the predetermined data pattern, and wherein the write adjust value is a number of cycles between signaling the DDR memory module of the one or more write operations and sending to the DDR memory module the predetermined amount of data of the predetermined pattern along with the data strobe signal.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION

Figure 1:
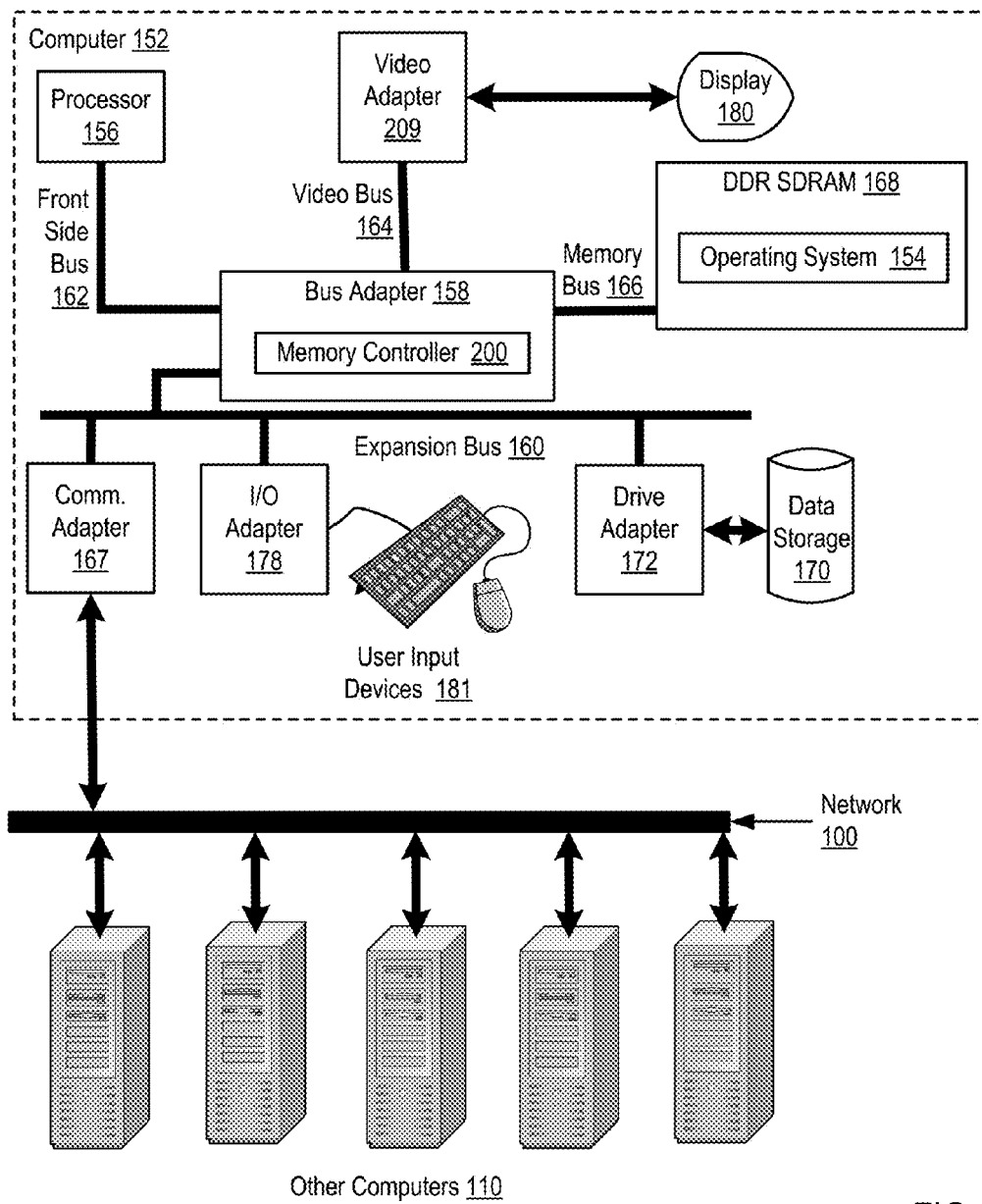
FIG. 1 sets forth a block diagram of automated computing machinery comprising an example computer useful in memory access alignment in a DDR system according to embodiments of the present invention.

Example methods, apparatus, and products for memory access alignment in a double data rate ('DDR') system in accordance with the present invention are described with reference to the accompanying drawings. Memory access alignment in a DDR system in accordance with the present invention is generally implemented with computers, that is, with automated computing machinery. For further explanation, therefore, FIG. 1 sets forth a block diagram of automated computing machinery comprising an example computer (152) useful in memory access alignment in a DDR system according to embodiments of the present invention. The computer (152) of FIG. 1 includes at least one computer processor (156) or 'CPU' as well as DDR synchronous dynamic random access memory (168) ('DDR SDRAM') which is connected through a high speed memory bus (166) and bus adapter (158) to processor (156) and to other components of the computer (152).

Stored in the DDR SDRAM (168) is an operating system (154). Operating systems useful for memory access alignment in a DDR system according to embodiments of the present invention include UNIX™, Linux™, Microsoft XP™, AIX™, IBM's i5/OS™, and others as will occur to those of skill in the art. The operating system (154) in the example of FIG. 1 is shown in DDR SDRAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for memory access alignment in a DDR system according to embodiments of the present invention include Integrated Drive Electronics ('IDE') adapters, Small Computer System Interface (SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The example computer (152) of FIG. 1 includes a communications adapter (167) for data communications with other computers (110) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in systems that carry out memory access alignment in a DDR system according to embodiments of the present invention include modems for wired dial-up communications, Ethernet (IEEE 802.3) adapters for wired data communications network communications, and 802.11 adapters for wireless data communications network communications.

The example computer (152) of FIG. 1 also includes a memory controller (200). The memory controller (200) of FIG. 1 is a circuit that manages the flow of data going to and from memory. In the example of FIG. 1, the memory controller (200) manages the flow of data to and from one or more DDR memory modules, embodied here as the DDR SDRAM (168). In the example of FIG. 1, the memory controller (200) is depicted as residing within the bus adapter (158). Readers will appreciate that the memory controller (200) may be a standalone unit, included in DDR modules themselves, included in a northbridge or southbridge, on a microprocessor, or embodied in other ways as will occur to those of skill in the art.

The computer (152) of FIG. 1 is an example of a DDR system as the term is used in this specification. In the example of DDR system (152) of FIG. 1, memory access alignment in a DDR system in accordance with embodiments of the present invention includes executing, by the memory controller (200), one or more write operations to a predetermined address of a DDR memory module. In the example of FIG. 1, executing one or more write operations to a predetermined address of a DDR memory module includes signaling the DDR memory module of the one or more write operations and sending to the DDR memory module a predetermined amount of data of a predetermined pattern along with a data strobe signal.

In the example of FIG. 1, memory access alignment in a DDR system (152) in accordance with embodiments of the present invention also includes executing, by the memory controller, a plurality of read operations from the predetermined address of the DDR memory module. In the example of FIG. 1, executing a plurality of read operations from the predetermined address of the DDR memory module includes signaling the DDR memory module of the read operations and capturing data transmitted from the DDR memory module.

In the example of FIG. 1, memory access alignment in a DDR system (152) in accordance with embodiments of the present invention also includes determining, by the memory controller, a read adjust value and a write adjust value in dependence upon the data captured in response to the read operations. In the example of FIG. 1, the read adjust value is a number of cycles to adjust a read latency interval between signaling the read operations and capturing the data. In the example of FIG. 1, the write adjust value is a number of cycles to adjust a write latency interval between signaling the DDR memory module of the one or more write operations and sending to the DDR memory module the predetermined amount of data of the predetermined pattern along with the data strobe signal.

Figure 2:
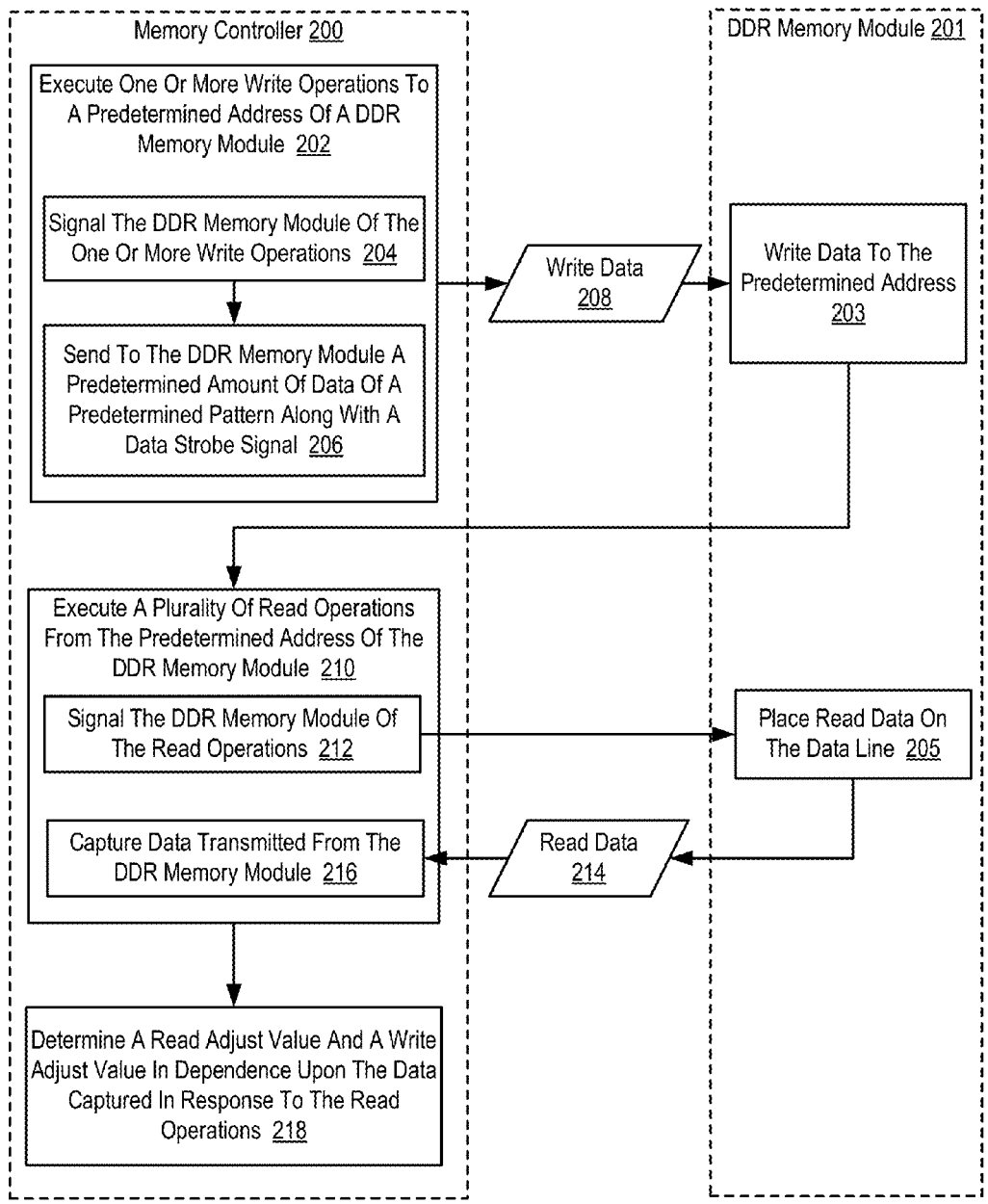
FIG. 2 sets forth a flow chart illustrating an example method for memory access alignment in a DDR system according to embodiments of the present invention.

For further explanation, FIG. 2 sets forth a flow chart illustrating an example method for memory access alignment in a DDR system according to embodiments of the present invention that includes executing (202), by a memory controller (200), one or more write operations to a predetermined address of a DDR memory module (201). In the example of FIG. 2, the memory controller (200) is a circuit that manages the flow of data going to and from memory, such as one or more DDR memory modules (201). Although the example described in FIG. 2, as well as the remaining figures of the present application, is described in the context of the DDR protocol, the concepts described herein can be applied to any DDR based protocol such as DDR2, DDR3, DDR4, QDR, RLDRAM, LLDRAM, and so on.

In the example of FIG. 2, executing (202), by a memory controller (200), one or more write operations to a predetermined address of a DDR memory module (201) includes signaling the DDR memory module of the one or more write operations and sending to the DDR memory module a predetermined amount of data of a predetermined pattern along with a data strobe signal. In the example of FIG. 2, executing (202) a single write operation would consist of a write command being issued to the DDR memory module (i.e., "signaling the DDR memory module of the write operation") and later in time, driving data to the DDR memory module (i.e., "sending to the DDR memory module a predetermined amount of data"). That is, a single write operation may be viewed as consisting of two coupled parts—a write command and the data that is to be written.

In the example of FIG. 2, executing (202) one or more write operations to a predetermined address of a DDR memory module (201) includes signaling (204) the DDR memory module (201) of the one or more write operations. Signaling (204) the DDR memory module (201) may be carried out, for example, by asserting a signal across a command control line between the memory controller (200) and the DDR memory module (201). In such an example, the DDR memory module (201) may be configured such that, after determining that the command control line has been asserted, the DDR memory module (201) stores data asserted on data signal lines at a memory location specified by an address asserted on address signal lines. That is, the command control line, for a write command, initiates the storage of data at a memory location.

In the example of FIG. 2, executing (202) one or more write operations to a predetermined address of a DDR memory module (201) also includes sending (206) to the DDR memory module (201) a predetermined amount of data (208) of a predetermined pattern along with a data strobe signal. In the example of FIG. 2, a data strobe signal is bi-directional signal that is used to initiate read operations from a DDR memory module (201) and write operations to the DDR memory module (201). For write commands, the pulses of the data strobe signal are used as clock signals by a DDR memory module (201) to capture the corresponding input data for a write command which, in the example of FIG. 2, is embodied as the predetermined amount of data (208).

In the example of FIG. 2, the predetermined amount of data (208) associated with the one or more write commands represents that data that is to be written to the predetermined address as the result of the one or more write commands. In the example of FIG. 2, sending (206) to the DDR memory module (201) a predetermined amount of data (208) of a predetermined pattern along with a data strobe signal may be carried out, for example, by sending the predetermined amount of data (208) and a predetermined number of pulses of the data strobe signal over a memory bus.

The predetermined amount of data (208) of FIG. 2 may include data generated according to a predetermined pattern. For example, the predetermined amount of data (208) of FIG. 2 may include data generated according to a predetermined pattern that is characterized by increasing numerical values. For example, consider an embodiment in which the predetermined amount of data (208) is sixteen bytes. In such an example, the first two bytes of the predetermined amount of data (208) may be a numerical '0,' the second two bytes of the predetermined amount of data (208) may be a numerical '1,' and so on such that the predetermined amount of data (208) is characterized by a numerical pattern of '00112233.' In such an example, because the values in the pattern don't use all available bits within a nibble or a byte, the algorithm can still be used in situations where bits are bad and have been masked off. For example, if another algorithm has discovered and marked a bit as bad, the algorithm can still work if the bad bit is masked off and data is steered away from the bad bit since all the values from hex 0 to hex 7 only require 3 bits and a fourth bad bit within a nibble can simply be masked off and steered around.

The example of FIG. 2 also includes executing (210), by the memory controller (200), a plurality of read operations from the predetermined address of the DDR memory module (201). In the example of FIG. 2, executing (210) a plurality of read operations from the predetermined address of the DDR memory module (201) includes signaling (212) the DDR memory module (201) of the read operations. Signaling (212) the DDR memory module (201) may be carried out, for example, by deasserting a signal across a command control line between the memory controller (200) and the DDR memory module (201). In such an example, the DDR memory module (201) may be configured such that, after determining that the command control line has been deasserted, the DDR memory module (201) reads data from a memory location specified by an address asserted on address signal lines. That is, the command control line when deasserted initiates the reading of data from a memory location. In such an example, the DDR memory module (201) subsequently places (205) the read data (214) on a data line for transmission to the memory controller (200).

In the example of FIG. 2, executing (210) a plurality of read operations from the predetermined address of the DDR memory module (201) also includes capturing (216) data transmitted from the DDR memory module (201). In the example of FIG. 2, the memory controller (200) operates to capture (216) at least some portion of the read data (214) sent from the DDR memory module (201). Such data may be captured, for example, by reading a data line between the DDR memory module (201) and the memory controller (200).

The example of FIG. 2 also includes determining (218), by the memory controller (200), a read adjust value and a write adjust value in dependence upon the data captured in response to the read operations. In the example of FIG. 2, the read adjust value is a number of cycles to adjust a read latency interval between signaling (212) the read operations and capturing (216) the data. In the example of FIG. 2, there may be a delay between the time when the DDR memory module signals (212) the read operations and the time that the read data (214) is available for reading at the memory controller (200). This delay is referred to in this specification as the read latency interval. The read latency interval may exist because the DDR memory module (201) needs some amount of time to identify that a read operation is requested, the DDR memory module (201) needs some amount of time to retrieve the requested data, the DDR memory module (201) needs some amount of time to place (205) the read data (214) on a data line, and other similar reasons. In the example of FIG. 2, the read adjust value represents the number of cycles that the read latency interval should be adjusted so as to ensure proper timing.

In the example of FIG. 2, the write adjust value is a number of cycles to adjust a write latency interval between signaling (204) the DDR memory module (201) of the one or more write operations and sending (206) to the DDR memory module (201) the predetermined amount of data (208) of the predetermined pattern along with the data strobe signal. In the example of FIG. 2, there may be need to be a delay between the time when the DDR memory module signals (204) the DDR memory module (201) of the one or more write operations and sends (206) to the DDR memory module (201) the predetermined amount of data (208) of the predetermined pattern along with the data strobe signal. This delay is referred to in this specification as the write latency interval. The write latency interval may exist because the DDR memory module (201) needs some amount of time to receive and process a request to perform a write operation. In the example of FIG. 2, the write adjust value represents the number of cycles that the write latency interval should be adjusted so as to ensure proper timing. Determining (218), by the memory controller (200), a read adjust value and a write adjust value in dependence upon the data captured in response to the read operations will be described in greater detail in the remaining figures.

Figure 3:
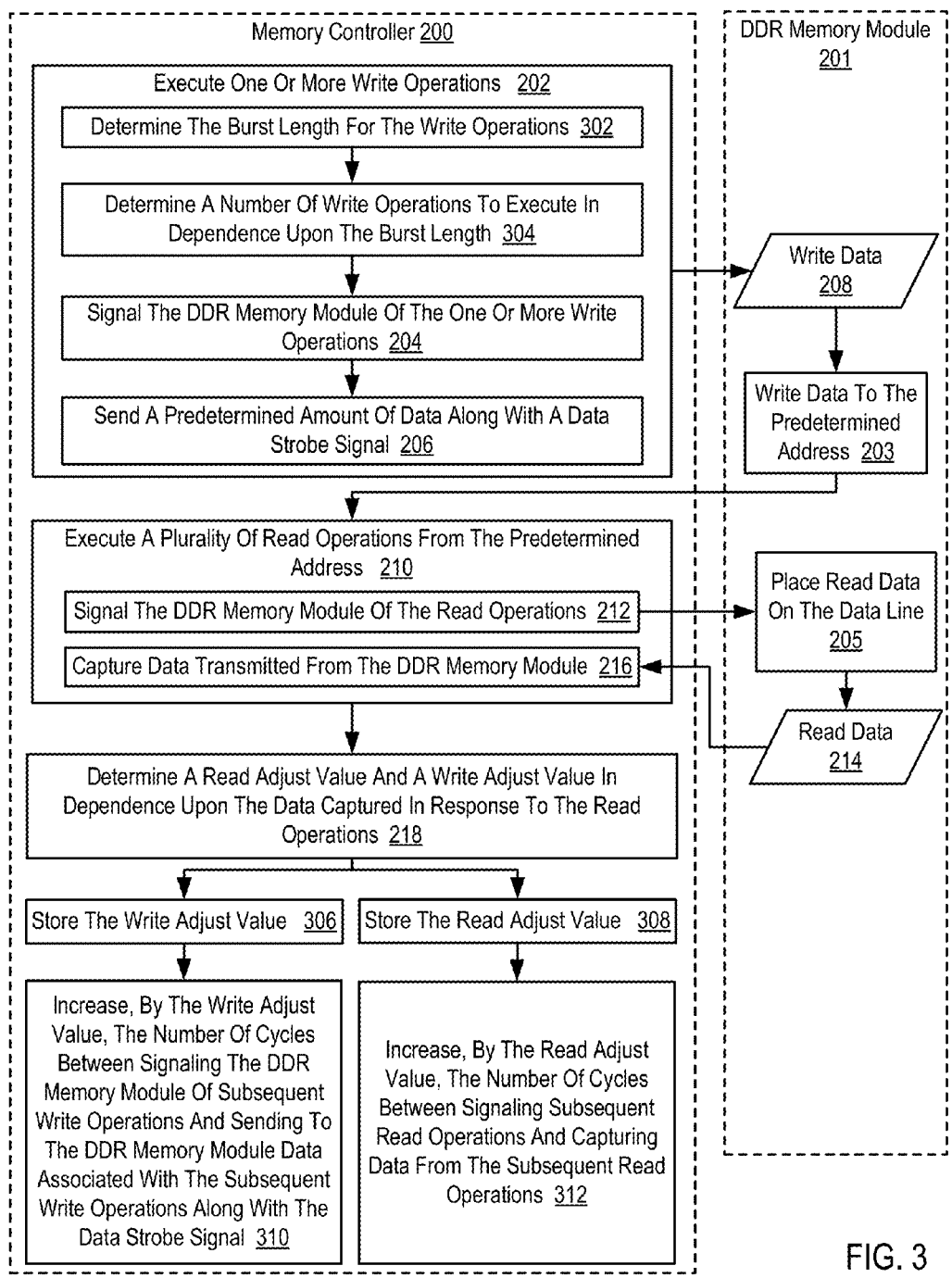
FIG. 3 sets forth a flow chart illustrating an example method for memory access alignment in a DDR system according to embodiments of the present invention.

For further explanation, FIG. 3 sets forth a flow chart illustrating an example method for memory access alignment in a DDR system according to embodiments of the present invention. The example of FIG. 3 is similar to the example of FIG. 2 as the example of FIG. 3 also includes executing (202), by a memory controller (200), one or more write operations to a predetermined address of a DDR memory module (201), including signaling (204) the DDR memory module (201) of the one or more write operations and sending (206) to the DDR memory module (201) a predetermined amount of data (208) of a predetermined pattern along with a data strobe signal. The example of FIG. 3, like the example of FIG. 2, also includes executing (210), by the memory controller (200), a plurality of read operations from the predetermined address of the DDR memory module (201), including signaling (212) the DDR memory module (201) of the read operations and capturing (216) data transmitted from the DDR memory module (201). The example of FIG. 3, like the example of FIG. 2, also includes determining (218), by the memory controller (200), a read adjust value and a write adjust value in dependence upon the data captured in response to the read operations. In the example of FIG. 3, the read adjust value is a number of cycles to adjust a read latency interval between signaling (212) the read operations and capturing (216) the data. In the example of FIG. 3, the write adjust value is a number of cycles to adjust a write latency interval between signaling (204) the DDR memory module (201) of the one or more write operations and sending (206) to the DDR memory module (201) the predetermined amount of data of the predetermined pattern along with the data strobe signal.

In the example of FIG. 3, however, executing (202) one or more write operations to a predetermined address of the DDR memory module (201) also includes determining (302), by the memory controller (200), the burst length for the write operations. In the example of FIG. 3, the burst length for a write command represents the number of bytes that are to be written to an address in response to a single write command. Different versions of DDR memory modules may be associated with different burst lengths such that determining (302), by the memory controller (200), the burst length for a write command may be carried out, for example, by identifying whether the target DDR memory module is a DDR1 memory module, DDR2 memory module, DDR 3 memory module, and so on.

In the example of FIG. 3, executing (202) one or more write operations to a predetermined address of the DDR memory module (201) also includes determining (304), by the memory controller (200), a number of write operations to execute in dependence upon the burst length. For example, DDR3 has a burst length of eight ('BL8') such that each read operation reads eight bytes of data and each write operation writes eight bytes of data. Memory access alignment in a DDR system may be carried out, however, for different versions of DDR memory modules by taking into account the burst length associated with the different versions of DDR. For example, rather than issuing a single BL8 command to a DDR memory module, the memory controller (200) may alternatively issue two burst length four ('BL4') write commands to the DDR memory module. Furthermore, different burst lengths may be utilized not for the purpose of mimicking a single BL8 but rather for adapting the present invention for different systems and embodiments. In embodiments in which the burst length is not BL8, different patterns of numerical values may be used to identify the read latency and write latency for a particular system.

The example of FIG. 3 also includes storing (308), by the memory controller (200), the read adjust value. In the example of FIG. 3, the read adjust value may be stored (308), for example, in computer memory on the memory controller (200) itself or in computer memory otherwise accessible to the memory controller (200).

The example of FIG. 3 also includes increasing (312), by the read adjust value, the number of cycles between signaling subsequent read operations and capturing data from the subsequent read operations. As discussed above, the read adjust value is a number of cycles to adjust a read latency interval between signaling (212) the read operations and capturing (216) the data. In the example of FIG. 3, adjusting the read latency interval may be carried out by increasing the number of cycles between signaling subsequent read operations and capturing data from the subsequent read operations by a number of cycles that is equal to the read adjust value for subsequently issued read commands.

The example of FIG. 3 also includes storing (306), by the memory controller (200), the write adjust value. In the example of FIG. 3, the write adjust value may be stored (306), for example, in computer memory on the memory controller (200) itself or in computer memory otherwise accessible to the memory controller (200).

The example of FIG. 3 also includes increasing (310), by the write adjust value, the number of cycles between signaling the DDR memory module of subsequent write operations and sending to the DDR memory module data associated with the subsequent write operations along with the data strobe signal. As discussed above, the write adjust value is a number of cycles to adjust a write latency interval between signaling (204) the DDR memory module (201) of the one or more write operations and sending (206) to the DDR memory module (201) the predetermined amount of data (208) of the predetermined pattern along with the data strobe signal. In the example of FIG. 3, adjusting the write latency interval may be carried out by increasing the number of cycles between signaling the DDR memory module (201) of the subsequent write operations and sending to the DDR memory module data associated with the subsequent write operations along with the data strobe signal. Although the example of FIG. 3 describes increasing (310) the number of cycles between signaling the DDR memory module of subsequent write operations and sending to the DDR memory module data associated with the subsequent write operations, readers will appreciate that using different patterns of numerical values would allow the number of cycles between signaling the DDR memory module and sending to the DDR memory module data associated with the subsequent write operations to be decreased in other embodiments of the present invention. In such embodiments a 'negative adjust' may be utilized for memory access alignment in a DDR system according to embodiments of the present invention.

Figure 4:
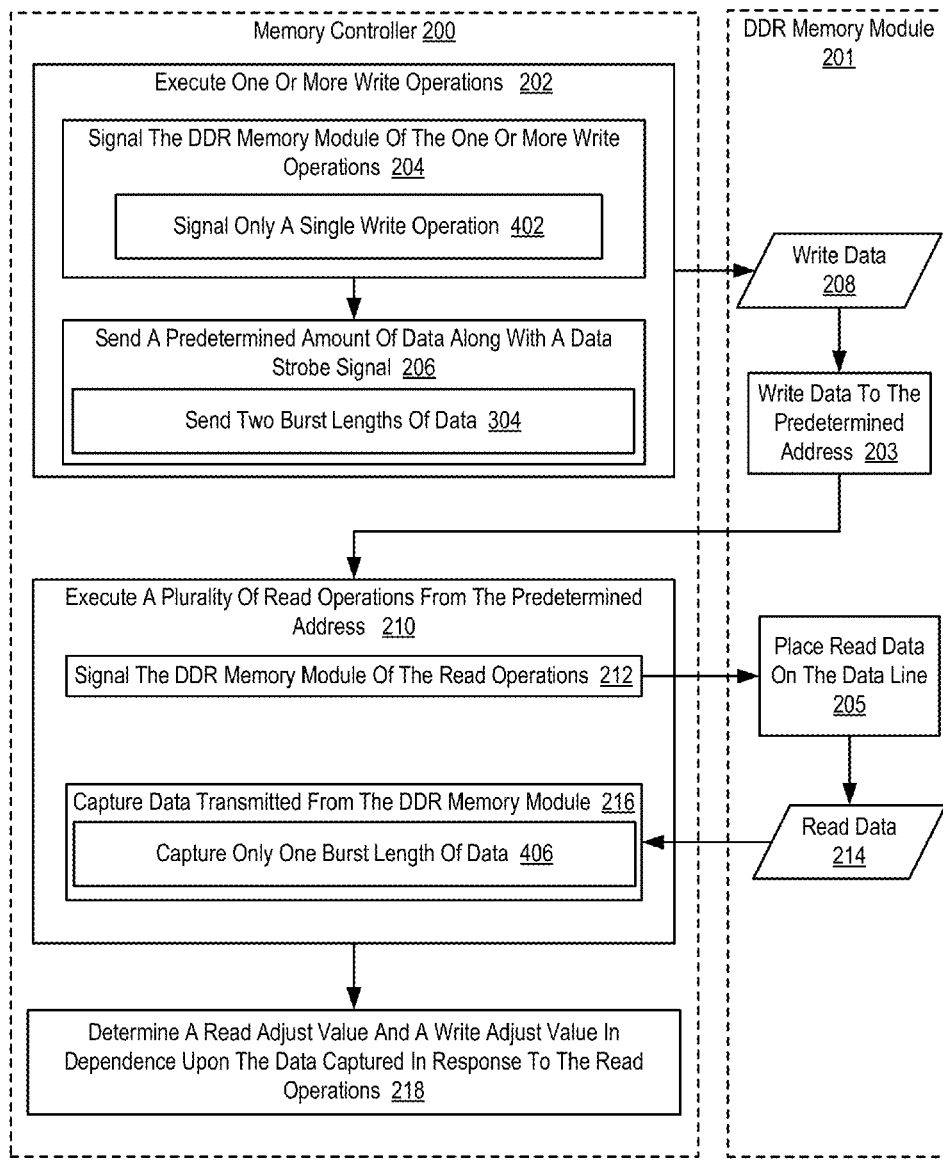
FIG. 4 sets forth a flow chart illustrating an example method for identifying, by the memory controller, a read adjust value and a write adjust value in dependence upon the data received from the one or more read commands according to embodiments of the present invention.

For further explanation, FIG. 4 sets forth a flow chart illustrating an example method for memory access alignment in a DDR system according to embodiments of the present invention. The example of FIG. 4 is similar to the example of FIG. 2 as the example of FIG. 4 also includes executing (202), by a memory controller (200), one or more write operations to a predetermined address of a DDR memory module (201), including signaling (204) the DDR memory module (201) of the one or more write operations and sending (206) to the DDR memory module (201) a predetermined amount of data (208) of a predetermined pattern along with a data strobe signal. The example of FIG. 4, like the example of FIG. 2, also includes executing (210), by the memory controller (200), a plurality of read operations from the predetermined address of the DDR memory module (201), including signaling (212) the DDR memory module (201) of the read operations and capturing (216) data transmitted from the DDR memory module (201). The example of FIG. 4, like the example of FIG. 2, also includes determining (218), by the memory controller (200), a read adjust value and a write adjust value in dependence upon the data captured in response to the read operations. In the example of FIG. 4, the read adjust value is a number of cycles to adjust a read latency interval between signaling (212) the read operations and capturing (216) the data. In the example of FIG. 4, the write adjust value is a number of cycles to adjust a write latency interval between signaling (204) the DDR memory module (201) of the one or more write operations and sending (206) to the DDR memory module (201) the predetermined amount of data of the predetermined pattern along with the data strobe signal.

In the example of FIG. 4, however, executing (202), by a memory controller (200), one or more write operations to a predetermined address of a DDR memory module (201) includes signaling (402) only a single write operation. In the example of FIG. 4, the single write operation that is signaled (402) is a BL8 write operation. As described above with reference to FIG. 2, a single write operation may be viewed as consisting of two coupled parts—a write command and the data that is to be written. In the example of FIG. 4, signaling (402) only a single write operation may include issuing, by the memory controller, two write operations but only signaling the DDR memory module (201) of one of the write operations. As such, although only a single write operation is signaled (402), more than a single operation's worth of data may still be sent to the DDR memory module (201) such that the DDR memory module (201) receives only one write command but still receives enough data for two write commands.

In the example of FIG. 4, sending (206) to the DDR memory module (201) a predetermined amount of data of a predetermined pattern along with a data strobe signal includes sending (404) two burst lengths of data. In the example of FIG. 4, given that a single BL8 write command is being signaled (402) as described above, the burst length is therefore eight bytes. In such an example, sending (404) two burst lengths of data therefore includes sending sixteen bytes of data in spite of the fact that only eight bytes of data are needed for execution of the single BL8 write operation. As described above with reference to FIG. 2, a single write operation may be viewed as consisting of two coupled parts—a write command and the data that is to be written. The benefit of sending (404) two burst lengths of data will become apparent below.

In the example of FIG. 4, the write data (208) sent (206) to the DDR memory module (201) is of a predetermined pattern. In the example of FIG. 4, the predetermined pattern includes numerical values from 0 to 7 organized incrementally. As discussed above, two burst lengths of data are being sent (404) according to the predetermined pattern described above. The write data (208) of a predetermined pattern may therefore be embodied as sixteen bytes of data, where the first byte and second byte of data are a numerical '0', the third byte and the fourth byte of data are a numerical '1', the fifth byte and sixth byte of data is a numerical '2', and so on such that the sixteen bytes of data are as follows: 0011223344556677. Although this sixteen byte pattern is sent (206) to the DDR memory module (201), only eight bytes of this data will be written to the DDR memory module (201) as only a single BL8 write operation is being signaled (402). By determining which eight bytes were written to the DDR memory module (201), a write adjust value can be determined (218) as described in more detail below.

In the example of FIG. 4, capturing (216) data transmitted from the DDR memory module (201) includes capturing (406) only one burst length of data. As discussed above, a plurality of read operations are being executed (210). In the example of FIG. 4, each read operation is a BL8 read operation. Although at least two read operations are being executed by the DDR memory module (201), only one burst length of data is being captured (406) by the memory controller (200). The memory controller (200) may capture (406) only one burst length of data by only initiating one read start operation at the memory controller (200), where the read start operation causes the memory controller to begin listening to the pertinent control, signal, and data lines. By determining which eight bytes were captured (406) by the memory controller (200), a read adjust value can be determined (218) as described in more detail below.

Figure 5:
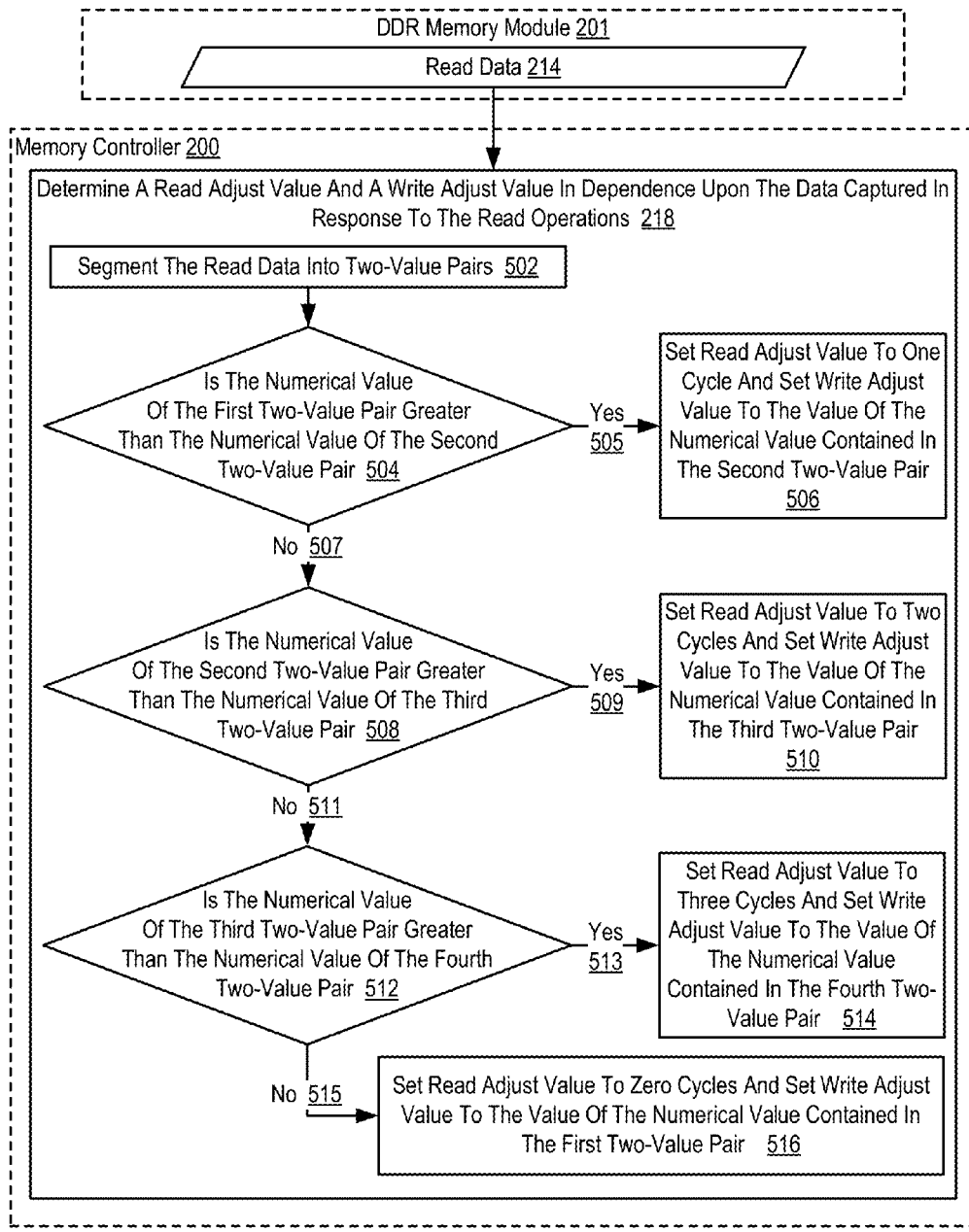
FIG. 5 sets forth a flow chart illustrating an example method for memory access alignment in a DDR system according to embodiments of the present invention.

For further explanation, FIG. 5 sets forth a flow chart illustrating an example method for determining (218), by the memory controller (201), a read adjust value and a write adjust value in dependence upon the data captured in response to the read operations according to embodiments of the present invention. As described above, a data strobe signal is bi-directional signal that is used to initiate read operations from a DDR memory module (201) and write operations to the DDR memory module (201). For write operations, the data strobe signal is generated by the memory controller (200) that initiated the write operation. A DDR memory module (201) that receives a write signal from the memory controller (200) will read data on a data line upon receipt of the data strobe signal from the memory controller (200). In particular, the DDR memory module (201) that receives a write signal from a memory controller (200) will read data on the data line at both the rising edge of a data strobe signal pulse and also at the falling edge of a data strobe signal pulse.

For read operations, the data strobe signal is generated by the DDR memory module (201) that is transferring the read data (214) in response to a read signal received from the memory controller (200). A memory controller (200) that initiates a read operation will read data from a data line upon receipt of a data strobe signal from the DDR memory module (201). The data that the memory controller (200) reads from a data line is data placed on the data line by the DDR memory module (201) in response to the read operation. In particular, the memory controller (200) that initiates a read operation will read data from a data line at both the rising edge of a data strobe signal pulse and also at the falling edge of a data strobe signal pulse.

In view of the fact that the data strobe signal can be sent from the memory controller (200) to the DDR memory module (201) or sent from the DDR memory module (201) to the memory controller (200), the data strobe signal is said to be bi-directional. Because the data strobe signal is used to initiate read operations from the DDR memory module (201) and write operations to the DDR memory module (201), however, a write latency may exist such that the memory controller (200) delays sending the data strobe signal to the DDR memory module (201) when initiating write operations so that the DDR memory module (201) reads the correct data off of the data line upon receipt of the data strobe signal pulses. Likewise, a read latency may exist such that the memory controller (200) delays reading from a data line after initiating a read operation so as to give the DDR memory module (201) an appropriate amount of time to place read data (214) on a data line. The write latency and read latency may need to be increased to ensure proper timing. In the example of FIG. 5, the number of cycles that the write latency and read latency need to be increased is identified as the write adjust value and read adjust value respectively.

The example of FIG. 5 describes determining (218), by the memory controller (201), a read adjust value and a write adjust value in dependence upon the data captured in response to the read operations is described in a particular context. The example of FIG. 5 describes determining (218) a read adjust value and a write adjust value in an example in which the steps described in FIG. 4 were carried out. That is, the example of FIG. 5 assumes the following:

The memory controller (200) executed a single BL8 write command in which data was written to the DDR memory module (201) as described above with reference to FIG. 4;

the memory controller (200) sent sixteen bytes worth of data to the DDR memory module (201) over a data line while also sending pulses of the data strobe signal to the DDR memory module (201) as described above with reference to FIG. 4;

the sixteen bytes of data sent by the memory controller (200) to the DDR memory module (201) included numerical values of 0, 0, 1, 1, 2, 2, 3, 3, 4, 4, 5, 5, 6, 6, 7, and 7 as described above with reference to FIG. 4, and the memory controller (200) executed two BL8 read commands to read data from the predetermined address and the memory controller (200) also captured only eight bytes of the read data (214) as described above with reference to FIG. 4.

In the example of FIG. 5, the memory controller (200) may determine (218) a read adjust value and a write adjust value in dependence upon the read data (214) received from the one or more read operations. In the example of FIG. 5, the memory controller (200) may determine (218) a read adjust value and a write adjust value by segmenting (502) the eight bytes of read data (214) that were captured by the memory controller (200) into memory controller (200) four two-value pairs.

In the example of FIG. 5, the memory controller (200) may determine (218) a read adjust value and a write adjust value in dependence upon the data (214) received from the one or more read commands by determining (504), whether a numerical value in a first unit of the captured data is greater than a numerical value in a second unit of the captured data. In the example of FIG. 5, the first unit of the captured data is the first two-value pair and the second unit of the captured data is the second two-value pair. If the numerical value in the first two-value pair read by the memory controller (200) is (505) greater than the numerical value in the second two-value pair read by the memory controller (200), the memory controller can set (506) the read adjust value to one cycle and also set (506) the write adjust value to the value of the numerical value contained in the second two-value pair.

In the example of FIG. 5, the numerical value in the first two-value pair read by the memory controller (200) may only be greater than the numerical value in the second two-value pair read by the memory controller (200) when the memory controller (200) is reading: 1) the last two-value pair placed on the data line from the first BL8 read command, and 2) the first three two-value pairs placed on the data line from the second BL8 read command.

In the example in which the numerical value in the first two-value pair read by the memory controller (200) is greater than the numerical value in the second two-value pair read by the memory controller (200), the read adjust value should be set (506) to one cycle such that the read latency interval between signaling the read operations and capturing the read data is increased by one cycle. Furthermore, when the numerical value in the first two-value pair read by the memory controller (200) is greater than the numerical value in the second two-value pair read by the memory controller (200), the write adjust value should be set to the value of the numerical value contained in the second two-value pair read by the memory controller (200). Consider two situations: 1) a first situation in which signaling the DDR memory module (201) of the one or more write operations and sending write data and the data strobe signal pulses to the DDR memory module (201) were perfectly timed, and 2) a second situation in which signaling the DDR memory module (201) of the one or more write operations and sending write data and the data strobe signal pulses to the DDR memory module (201) were not perfectly timed.

In the situation in which signaling the DDR memory module (201) of the one or more write operations and sending write data and the data strobe signal pulses to the DDR memory module (201) were perfectly timed, because a single BL8 write operation was executed and followed by a data stream of numerical values of 0, 0, 1, 1, 2, 2, 3, 3, 4, 4, 5, 5, 6, 6, 7, and 7, the DDR memory module (201) would have stored values of 0, 0, 1, 1, 2, 2, 3, and 3 at the predetermined address. In such an example, the first BL8 read operation would place 0, 0, 1, 1, 2, 2, 3, and 3 on the data line and the second BL8 read operation would also place 0, 0, 1, 1, 2, 2, 3, and 3 on the data line. In order for the numerical value in the first two-value pair read by the memory controller (200) to be greater than the numerical value in the second two-value pair read by the memory controller (200), the memory controller (200) would need to read two-value pair values of 33, 00, 11, 22. In other words, the numerical value in the first two-value pair read by the memory controller (200) may only be greater than the numerical value in the second two-value pair read by the memory controller (200) when the memory controller (200) is reading: 1) the last two-value pair placed on the data line from the first BL8 read operation, and 2) the first three two-value pairs placed on the data line from the second BL8 read operation.

The read adjust value should therefore be set (506) to one cycle such that the read latency interval between signaling the read operations and capturing the read data is increased by one cycle. Furthermore, the write adjust value should be set to the value of the numerical value contained in the second two-value pair read by the memory controller (200). In this case that value is '0', which is to be expected in the situation in which signaling the DDR memory module (201) of the one or more write operations and sending write data and the data strobe signal pulses to the DDR memory module (201) were perfectly timed.

Alternatively, in the second situation in which signaling the DDR memory module (201) of the one or more write operations and sending write data and the data strobe signal pulses to the DDR memory module (201) were not perfectly timed, the approach still works. Consider, for example, that sending write data and the data strobe signal pulses to the DDR memory module (201) needed to be delayed by two cycles such that the DDR memory module (201) would have stored the values of 2, 2, 3, 3, 4, 4, 5, and 5 (i.e., the values of 0, 0, 1, and 1 that were placed on the data line were gone when the DDR memory module (201) began reading from the data line in response to the data strobe signal pulses) at the predetermined address. The first BL8 read operation would therefore place 2, 2, 3, 3, 4, 4, 5, and 5 on the data line and the second BL8 read operation would also place 2, 2, 3, 3, 4, 4, 5, and 5 on the data line. In order for the numerical value in the first two-value pair read by the memory controller (200) to be greater than the numerical value in the second two-value pair read by the memory controller (200), the memory controller (200) would need to read two-value pair values of 55, 22, 33, and 44. In other words, the numerical value in the first two-value pair read by the memory controller (200) may only be greater than the numerical value in the second two-value pair read by the memory controller (200) when the memory controller (200) is reading: 1) the last two-value pair placed on the data line from the first BL8 read operation, and 2) the first three two-value pairs placed on the data line from the second BL8 read operation.

The read adjust value should therefore be set to one cycle such that the read latency interval between signaling the read operations and capturing the read data is increased by one cycle. Furthermore, the write adjust value should be set to the value of the numerical value contained in the second two-value pair read by the memory controller (200). In this case that value is '2', which is to be expected in the situation in which the data and data strobe signal needed to be delayed by two additional cycles.

In the example of FIG. 5, the memory controller (200) may also determine (218) a read adjust value and a write adjust value by determining (508), whether a numerical value in a second unit of the captured data is greater than a numerical value in a third unit of the captured data. In the example of FIG. 5, the second unit of the captured data is the second two-value pair and the third unit of the captured data is the third two-value pair. If the numerical value in the second two-value pair read by the memory controller (200) is (509) greater than the numerical value in the third two-value pair read by the memory controller (200), the memory controller can set (510) the read adjust value to two cycles and also set (510) the write adjust value to the numerical value contained in the third two-value pair.

In the example of FIG. 5, the numerical value in the second two-value pair read by the memory controller (200) may only be greater than the numerical value in the third two-value pair read by the memory controller (200), after making the determination described in step 504, when the memory controller (200) is reading: 1) the last two two-value pairs placed on the data line from the first BL8 read operation, and 2) the first two two-value pairs placed on the data line from the second BL8 read operation.

In the example in which the numerical value in the second unit of the captured data is greater than the numerical value in the third unit of the captured data, the read adjust value should be set (506) to two cycles such that the read latency interval between signaling the read operations and capturing the read data is increased by two cycles. Furthermore, when the numerical value in the second two-value pair read by the memory controller (200) is greater than the numerical value in the third two-value pair read by the memory controller (200), after making the determination made in step 504, the write adjust value should be set to the numerical value contained in the third two-value pair read by the memory controller (200). Consider two situations: 1) a first situation in which signaling the DDR memory module (201) of the one or more write operations and sending write data and the data strobe signal pulses to the DDR memory module (201) were perfectly timed, and 2) a second situation in which signaling the DDR memory module (201) of the one or more write operations and sending write data and the data strobe signal pulses to the DDR memory module (201) were not perfectly timed.

In the first situation in which signaling the DDR memory module (201) of the one or more write operations and sending write data and the data strobe signal pulses to the DDR memory module (201) were perfectly timed, because a single BL8 write operation was executed and followed by a data stream of numerical values of 0, 0, 1, 1, 2, 2, 3, 3, 4, 4, 5, 5, 6, 6, 7, and 7, the DDR memory module (201) would have stored values of 0, 0, 1, 1, 2, 2, 3, and 3 at the predetermined address. In such an example, the first BL8 read operation would place 0, 0, 1, 1, 2, 2, 3, and 3 on the data line and the second BL8 read operation would also place 0, 0, 1, 1, 2, 2, 3, and 3 on the data line. In order for the numerical value in the second two-value pair read by the memory controller (200) to be greater than the numerical value in the third two-value pair read by the memory controller (200), after making the determination described in step 504, the memory controller (200) would need to read two-value pair values of 22, 33, 00, and 11. In other words, the numerical value in the second two-value pair read by the memory controller (200) may only be greater than the numerical value in the third two-value pair read by the memory controller (200), after making the determination described in step 504, when the memory controller (200) is reading: 1) the last two two-value pairs placed on the data line from the first BL8 read operation, and 2) the first two two-value pairs placed on the data line from the second BL8 read operation.

The read adjust value should therefore be set (510) to two cycles such that the read latency interval between signaling the read operations and capturing the read data is increased by two cycles. Furthermore, the write adjust value should be set to the value of the numerical value contained in the third two-value pair read by the memory controller (200). In this case that value is '0', which is to be expected in the situation in which signaling the DDR memory module (201) of the one or more write operations and sending write data and the data strobe signal pulses to the DDR memory module (201) were perfectly timed.

Alternatively, in the second situation in which signaling the DDR memory module (201) of the one or more write operations and sending write data and the data strobe signal pulses to the DDR memory module (201) were not perfectly timed, the approach still works. Consider, for example, that sending write data and the data strobe signal pulses to the DDR memory module (201) needed to be delayed by three cycles such that the DDR memory module (201) would have stored values of 3, 3, 4, 4, 5, 5, 6, and 6 (i.e., the values of 0, 0, 1, 1, 2, and 2 that were placed on the data line were gone when the DDR memory module (201) began reading from the data line in response to the data strobe signal pulses) at the predetermined address. The first BL8 read operation would therefore place 3, 3, 4, 4, 5, 5, 6, and 6 on the data line and the second BL8 read operation would also place 3, 3, 4, 4, 5, 5, 6, and 6 on the data line. In order for the numerical value in the second two-value pair read by the memory controller (200) to be greater than the numerical value in the third two-value pair read by the memory controller (200), the memory controller (200) would need to read two-value pair values of 55, 66, 33, and 44. In other words, the numerical value in the second two-value pair read by the memory controller (200) may only be greater than the numerical value in the third two-value pair read by the memory controller (200), after making the determination described in step 504, when the memory controller (200) is reading: 1) the last two two-value pair placed on the data line from the first BL8 read operation, and 2) the first two two-value pairs placed on the data line from the second BL8 read operation.

The read adjust value should therefore be set (510) to two cycles such that the read latency interval between signaling the read operations and capturing the read data is increased by two cycles. Furthermore, the write adjust value should be set (510) to the value of the numerical value contained in the third two-value pair read by the memory controller (200). In this case that value is '3', which is to be expected in the situation in which the data strobe signal needed to be delayed by three additional cycles.

In the example of FIG. 5, the memory controller (200) may also determine (218) a read adjust value and a write adjust value by determining (512), whether a numerical value in a third unit of the captured data is greater than a numerical value in a fourth unit of the captured data. In the example of FIG. 5, the third unit of the captured data is the third two-value pair and the fourth unit of the captured data is the fourth two-value pair. If the numerical value in the third two-value pair read by the memory controller (200) is (515) greater than the numerical value in the fourth two-value pair read by the memory controller (200), the memory controller can set (514) the read adjust value to three cycles and also set (514) the write adjust value to the numerical value contained in the fourth two-value pair.

In the example of FIG. 5, the numerical value in the third two-value pair read by the memory controller (200) may only be greater than the numerical value in the fourth two-value pair read by the memory controller (200), after making the determinations described in steps 504 and 508, when the memory controller (200) is reading: 1) the last three two-value pairs placed on the data line from the first BL8 read operation, and 2) the first two-value pair placed on the data line from the second BL8 read operation.

In an example in which the numerical value in the third two-value pair read by the memory controller (200) is greater than the numerical value in the fourth two-value pair read by the memory controller (200), the read adjust value should be set (514) to three cycles such that the read latency interval between signaling the read operations and capturing the read data is increased by three cycles. Furthermore, when the numerical value in the third two-value pair read by the memory controller (200) is greater than the numerical value in the fourth two-value pair read by the memory controller (200), after making the determinations made in steps 504 and 508, the write adjust value should be set to the numerical value contained in the fourth two-value pair read by the memory controller (200). Consider two situations: 1) a first situation in which signaling the DDR memory module (201) of the one or more write operations and sending write data and the data strobe signal pulses to the DDR memory module (201) were perfectly timed, and 2) a second situation in which signaling the DDR memory module (201) of the one or more write operations and sending write data and the data strobe signal pulses to the DDR memory module (201) were not perfectly timed.

In the first situation in which signaling the DDR memory module (201) of the one or more write operations and sending write data and the data strobe signal pulses to the DDR memory module (201) were perfectly timed, because a single BL8 write operation was executed and followed by a data stream of numerical values of 0, 0, 1, 1, 2, 2, 3, 3, 4, 4, 5, 5, 6, 6, 7, and 7, the DDR memory module (201) would have stored values of 0, 0, 1, 1, 2, 2, 3, and 3 at the predetermined address. The first BL8 read operation would therefore place 0, 0, 1, 1, 2, 2, 3, and 3 on the data line and the second BL8 read operation would also place 0, 0, 1, 1, 2, 2, 3, and 3 on the data line. In order for the numerical value in the third two-value pair read by the memory controller (200) to be greater than the numerical value in the fourth two-value pair read by the memory controller (200), after making the determinations described in steps 504 and 508, the memory controller (200) would need to read two-value pair values of 11, 22, 33, and 00. In other words, the numerical value in the third two-value pair read by the memory controller (200) may only be greater than the numerical value in the fourth two-value pair read by the memory controller (200), after making the determinations described in steps 504 and 508, when the memory controller (200) is reading: 1) the last three two-value pairs placed on the data line from the first BL8 read operation, and 2) the first two-value pair placed on the data line from the second BL8 read operation.

The read adjust value should therefore be set (510) to three cycles such that the read latency interval between signaling the read operations and capturing the read data is increased by three cycles. Furthermore, the write adjust value should be set to the value of the numerical value contained in the fourth two-value pair read by the memory controller (200). In this case that value is '0', which is to be expected in the situation in which signaling the DDR memory module (201) of the one or more write operations and sending write data and the data strobe signal pulses to the DDR memory module (201) were perfectly timed.

Alternatively, in the second situation in which signaling the DDR memory module (201) of the one or more write operations and sending write data and the data strobe signal pulses to the DDR memory module (201) were not perfectly timed, the approach still works. Consider, for example, that sending write data and the data strobe signal pulses to the DDR memory module (201) needed to be delayed by one cycle such that the DDR memory module (201) would have stored values of 1, 1, 2, 2, 3, 3, 4, and 4 (i.e., the values of 0 and 0 that were placed on the data line were gone when the DDR memory module (201) began reading from the data line in response to the data strobe signal pulses) at the predetermined address. The first BL8 read operation would therefore place 1, 1, 2, 2, 3, 3, 4, and 4 on the data line and the second BL8 read operation would also place 1, 1, 2, 2, 3, 3, 4, and 4 on the data line. In order for the numerical value in the third two-value pair read by the memory controller (200) to be greater than the numerical value in the fourth two-value pair read by the memory controller (200), the memory controller (200) would need to read two-value pair values of 22, 33, 44, and 11. In other words, the numerical value in the third two-value pair read by the memory controller (200) may only be greater than the numerical value in the fourth two-value pair read by the memory controller (200), after making the determinations described in steps 504 and 508, when the memory controller (200) is reading: 1) the last three two-value pairs placed on the data line from the first BL8 read operation, and 2) the first two-value pair placed on the data line from the second BL8 read operation.

The read adjust value should therefore be set (514) to three cycles such that the read latency interval between signaling the read operations and capturing the read data is increased by three cycles. Furthermore, the write adjust value should be set (514) to the value of the numerical value contained in the fourth two-value pair read by the memory controller (200). In this case that value is '1', which is to be expected in the situation in which the data strobe signal needed to be delayed by one additional cycle.

In the event that the memory controller (200) determines (504) that the numerical value in the first two-value pair is not (407) greater than the numerical value in the second two-value pair, and subsequently determines (508) that the numerical value in the second two-value pair is not (411) greater than the numerical value in the third two-value pair, and subsequently determines (512) that the numerical value in the third two-value pair is not (415) greater than the numerical value in the fourth two-value pair, the read adjust value is set (516) to zero cycle and the write adjust value is set (516) to the value of the numerical value contained in the first two-value pair.

In the example of FIG. 5, if the numerical value of the first two-value pair is not (507) greater than the numerical value of the second two-value pair, the numerical value of the second two-value pair is not (511) greater than the numerical value of the third two-value pair, and the numerical value of the third two-value pair is not (515) greater than the numerical value of the fourth two-value pair, then the memory controller (200) is reading: 1) the entire contents of the second BL8 read operation, or 2) the entire contents of the first BL8 read operation at an 'aliased position'. Although the present application only presents examples and delay capabilities based on the memory controller reading the entire contents of the second BL8 read operation in this situation, the reader will appreciate that larger delays required to handle the aliased position could be accounted for and addressed by adapting the algorithm to a larger pattern or by making use of another coarse adjustment method when the aliased condition is detected.

In an example in which the memory controller (200) is reading the entire contents of the second BL8 read operation, the read adjust value should be set (516) to zero cycles. Furthermore, the write adjust value should be set to the value of the numerical value contained in the first two-value pair read by the memory controller (200). Consider two situations: 1) a first situation in which signaling the DDR memory module (201) of the one or more write operations and sending write data and the data strobe signal pulses to the DDR memory module (201) were perfectly timed, and 2) a second situation in which signaling the DDR memory module (201) of the one or more write operations and sending write data and the data strobe signal pulses to the DDR memory module (201) were not perfectly timed In the first situation in which signaling the DDR memory module (201) of the one or more write operations and sending write data and the data strobe signal pulses to the DDR memory module (201) were perfectly timed, because a single BL8 write operation was issued to a predetermined address and followed by a data stream of numerical values of 0, 0, 1, 1, 2, 2, 3, 3, 4, 4, 5, 5, 6, 6, 7, and 7, the DDR memory module (201) would have stored values of 0, 0, 1, 1, 2, 2, 3, and 3 at the predetermined address. The first BL8 read operation would therefore place 0, 0, 1, 1, 2, 2, 3, and 3 on the data line and the second BL8 read operation would also place 0, 0, 1, 1, 2, 2, 3, and 3 on the data line. In order to make all of the "No" (507, 511, 515) determinations described in steps 504, 508, and 512, the memory controller (200) would need to read two-value pair values of 00, 11, 22, and 33. In other words, the memory controller (200) is reading the four two-value pairs placed on the data line from the second BL8 read operation.

The read adjust value should therefore be set (516) to zero cycles such that the read latency interval between signaling the read operations and capturing the read data is not altered. Furthermore, the write adjust value should be set (516) to the value of the numerical value contained in the first two-value pair read by the memory controller (200). In this case that value is '0', which is to be expected in the situation in which signaling the DDR memory module (201) of the one or more write operations and sending write data and the data strobe signal pulses to the DDR memory module (201) were perfectly timed.

Alternatively, in the second situation in which signaling the DDR memory module (201) of the one or more write operations and sending write data and the data strobe signal pulses to the DDR memory module (201) were not perfectly timed, the approach still works. Consider, for example, that sending write data and the data strobe signal pulses to the DDR memory module (201) needed to be delayed by four cycles such that the DDR memory module (201) would have values of 4, 4, 5, 5, 6, 6, 7, and 7 (i.e., the values of 0, 0, 1, 1, 2, 2, 3, and 3 that were placed on the data line were gone when the DDR memory module (201) began reading from the data line in response to the data strobe signal pulses) at the predetermined address. The first BL8 read operation would therefore place 4, 4, 5, 5, 6, 6, 7, and 7 on the data line and the second BL8 read operation would also place 4, 4, 5, 5, 6, 6, 7, and 7 on the data line. In order to make all of the "No" (507, 511, 515) determinations described in steps 504, 508, and 512 the memory controller (200) would need to read two-value pair values of 44, 55, 66, and 77. In other words, the memory controller (200) is reading the four two-value pairs placed on the data line from the second BL8 read operation.

The read adjust value should be set (516) to zero cycles such that the read latency interval between signaling the read operations and capturing the read data is not altered. Furthermore, the write adjust value should be set to the value of the numerical value contained in the first two-value pair read by the memory controller (200). In this case that value is '4', which is to be expected in the situation in which the data strobe signal needed to be delayed by four additional cycles.

Figure 6:
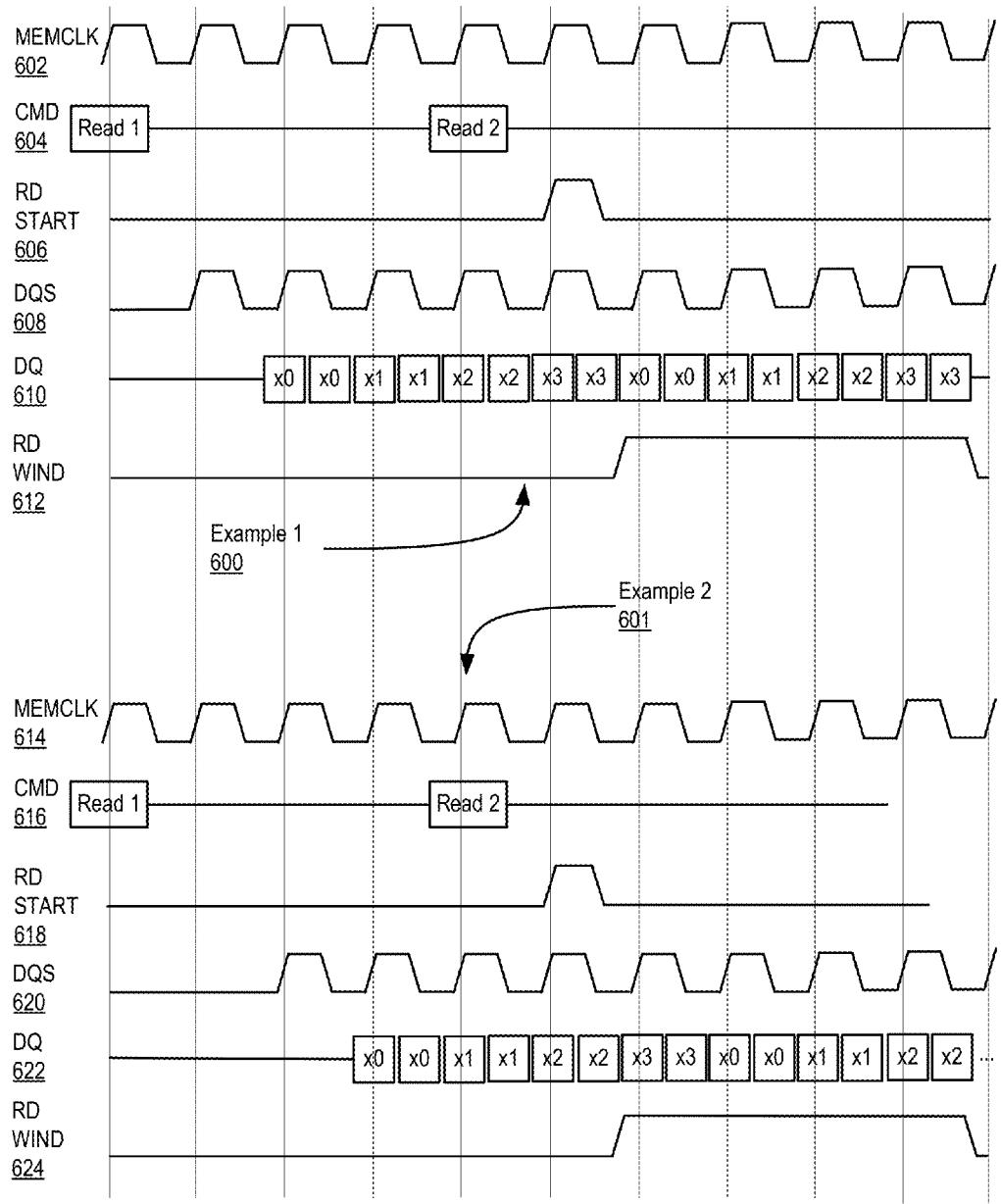
FIG. 6 sets forth a timing diagram of example read operations in a DDR system configured for memory access alignment in a DDR system.

For further explanation, FIG. 6 sets forth a timing diagram of example read operations in a DDR system configured for memory access alignment in a DDR system. The timing diagram includes two examples: example 1 (600) and example 2 (601). Example 1 (600) illustrates an example in which the read latency interval between signaling the read operations and capturing the data is ideal. In other words, example 1 (600) illustrates an example in which the read adjust value would be set to zero. Example 2 (601) illustrates an example in which the read latency interval between signaling the read operations and capturing the data is one cycle too short. In other words, example 2 (601) illustrates an example in which the read adjust value would be set to one.

Example 1 (600) illustrates a memory clock line (602), a command line (604), a read start line (606), a data strobe signal line (608), a data line (610), and a read window line (612). Example 2 (601) also illustrates a memory clock line (614), a command line (616), a read start line (618), a data strobe signal line (620), a data line (622), and a read window line (624).

In the example of FIG. 6, the memory clock lines (602, 614) represent clock signals generated by a memory clock. The command lines (604, 616) of FIG. 6 represent the status of a bus that runs between a memory controller and DDR memory module for signaling the DDR memory module of a read operation to be performed. In the example of FIG. 6, the command lines (604, 616) depict the signaling of read operations that are being initiated, by a memory controller, between the memory controller and a DDR memory module. A memory controller may signal a DDR memory module of such read operations, for example, by transferring an address to the DDR memory module from which data is to be read from. In example 1 (600) and example 2 (601), two read operations are signaled to the DDR memory module, operations labeled as 'Read 1' and 'Read 2'.

In the example of FIG. 6, the read start lines (606, 618) are representations of a timing mechanism used by a memory controller to initiate reading from a data bus between the memory controller and a DDR memory module. In the example of FIG. 6, a pulse on the read start lines (606, 618) represents a read start command. In the example of FIG. 6, the read start command causes a memory controller to begin reading from a data bus between the memory controller and a DDR memory module a set number of cycles after the read start command has been issued. In the particular example of FIG. 6, however, the read start command takes time to execute, such that a memory controller doesn't begin capturing data off of the data line until a set number of cycles after initiating the read start command. This delay is referred to herein the 'capture delay'. In the example of FIG. 6, the capture delay is one cycle as illustrated by the relative timing of the read start command and the read window that is described in more detail below.

In the example of FIG. 6, the data strobe signal lines (608, 620) are representations of data strobe signal pulses that are sent from a DDR memory module to a memory controller as a part of a read operation initiated by the memory controller. In such an example, the memory controller will read data on the data line at both the falling edge and rising edge of a data strobe signal pulse.

In the example of FIG. 6, the data lines (610, 622) are representations of the state of a memory bus that runs between a memory controller and a DDR memory module. The data lines (610, 622) depict particular bytes of data that are being transferred from a DDR memory module to the memory controller in response to a read operation initiated by the memory controller. In example 1 (600) and example 2 (601), byte values of 0, 0, 1, 1, 2, 2, 3, and 3 are placed on the memory bus by the DDR memory module in response to the first read operation labeled as 'Read 1'. In example 1 (600) and example 2 (601), the second read operation labeled as 'Read 2' also causes the DDR memory module to place byte values of 0, 0, 1, 1, 2, 2, 3, and 3 on the data (610) line, although only a subset of these bytes are illustrated in FIG. 6.

In the example of FIG. 6, the read window lines (612, 624) represent the window in which a memory controller reads from a data bus running between the memory controller and the DDR memory module. The example of FIG. 6 depicts an embodiment in which BL8 read operations are executed, such that the memory controller reads eight bytes of data off of the data bus to complete a read operation. Therefore, the read windows are eight bytes in burst length.

In the example of FIG. 6, the read latency for the DDR system that the timing diagram of FIG. 6 corresponds to is two cycles. The read latency for the DDR system represents the number of cycles between the time at which a DDR memory module was signaled of a read operation and the time at which the DDR memory module placed data on a data bus in response to the read operation.

In the example of FIG. 6, example 1 (600) depicts a perfectly timed read operation. In example 1 (600), a read operation, 'Read 1', is signaled and two cycles later the DDR memory module has begun data strobe signal pulsing and has placed data on a data bus, as a result of a read latency in the DDR system of two cycles as described above. In example 1 (600), a read start command was issued one cycle after the time that the read operation 'Read 2' was signaled. Because there is a capture delay of one cycle, as described above, the memory controller begins capturing data off of the data bus one cycle later as illustrated by the read window. In example 1 (600), the DDR memory module has placed data on the data bus at the same time that the memory controller begins to capture data from the memory bus, thereby causing the memory controller to perfectly capture the data transmitted from the DDR memory module in response to read operation 'Read 2'. In such an example, the read adjust value is zero and there is no adjustment needed between the time at which the memory controller signals the DDR memory module of a read operation and the time at which the memory controller captures the data placed on the data bus as a result of the read operation.

In the example of FIG. 6, however, example 2 (601) depicts an imperfectly timed read operation. In example 2 (601), a read operation, 'Read 2', is signaled and two cycles later the DDR memory module has begun data strobe signal pulsing and has placed data on a data bus, as a result of a read latency in the DDR system of two cycles as described above. In example 2 (601), a read start command was issued one cycle after the read operation 'Read 2' was signaled to the DDR memory module. Because there is a capture delay of one cycle, as described above, the memory controller begins capturing data off of the data bus one cycle later as illustrated by the read window. In example 2 (601), the DDR memory module has placed data on the data bus after the memory controller begins to capture data from the memory bus, thereby causing the memory controller to capture the last two bytes of data transmitted from the DDR memory module in response to read operation 'Read 1' and also to capture the first six bytes of data transmitted from the DDR memory module in response to read operation 'Read 2'. In such an example, the read adjust value is one, signifying that an adjustment of one cycle is needed between the time at which the memory controller signals the DDR memory module of a read operation and the time at which the memory controller captures the data placed on the data bus as a result of the read operation. The memory controller may make this adjustment by issuing the read start command one cycle later relative to signaling the DDR memory module of the read operation.

Figure 7:
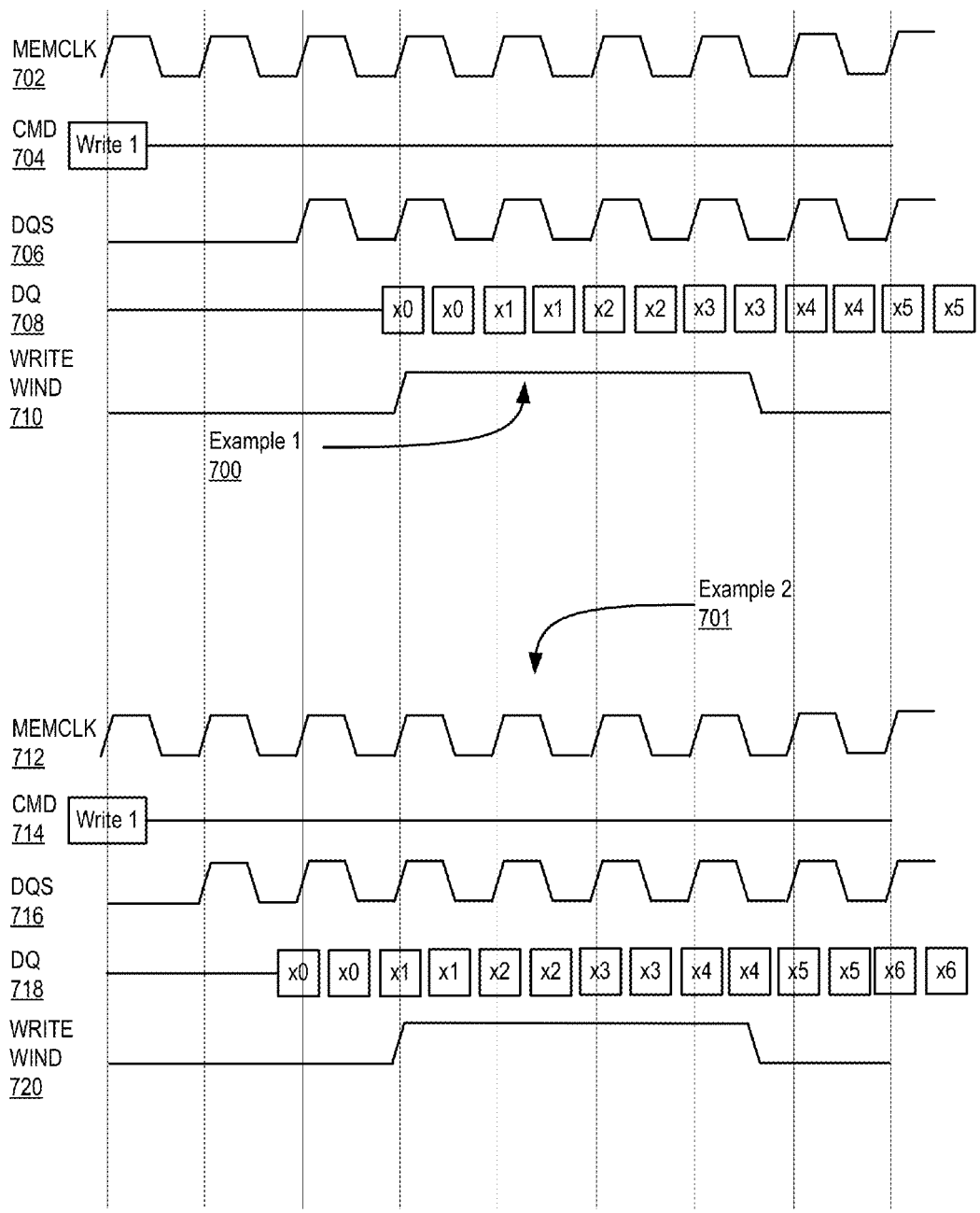
FIG. 7 sets forth a timing diagram of example write operations in a DDR system configured for memory access alignment in a DDR system.

For further explanation, FIG. 7 sets forth a timing diagram of example write operations in a DDR system configured for memory access alignment in a DDR system. The timing diagram includes two examples: example 1 (700) and example 2 (701). Example 1 (700) illustrates an example in which the write latency interval between signaling the DDR memory module of one or more write operations and sending to the DDR memory module the data associated with such write operations is ideal. In other words, example 1 (700) illustrates an example in which the write adjust value would be set to zero. Example 2 (701) illustrates an example in which the write latency interval between signaling the DDR memory module of one or more write operations and sending to the DDR memory module the data associated with such write operations is one cycle too short. In other words, example 2 (701) illustrates an example in which the write adjust value would be set to one.

Example 1 (700) illustrates a memory clock line (702), a command line (704), a data strobe signal line (706), a data line (708), and a write window line (710). Example 2 (701) also illustrates a memory clock line (712), a command line (714), a data strobe signal line (716), a data line (718), and a write window line (720).

In the example of FIG. 7, the memory clock lines (702, 712) represent clock signals generated by a memory clock. The command lines (704, 714) of FIG. 7 represent the status of a bus that runs between a memory controller and DDR memory module for signaling the DDR memory module of a write operation to be performed. In the example of FIG. 7, the command lines (704, 714) depict the signaling of a write operation that is being initiated, by a memory controller, between the memory controller and a DDR memory module. A memory controller may signal a DDR memory module of such write operations, for example, by transferring an address to the DDR memory module that data is to be written to. In example 1 (700) and example 2 (601), one write operation is signaled to the DDR memory module, operations labeled as 'Write 1'.

In the example of FIG. 7, the data strobe signal lines (706, 716) are representations of data strobe signal pulses that are sent from a memory controller to a DDR memory module as a part of a write operation initiated by the memory controller. In such an example, the DDR memory module will read data (i.e., the data to be written to the DDR memory module) on the data line at both the falling edge and rising edge of a data strobe signal pulse.

In the example of FIG. 7, the data lines (708, 718) are representations of the state of a memory bus that runs between a memory controller and a DDR memory module. The data lines (708, 718) depict particular bytes of data that are being transferred from a memory controller to DDR memory module as part of a write operation initiated by the memory controller. In example 1 (700) and example 2 (701), byte values of 0, 0, 1, 1, 2, 2, 3, 3, 4, 4, 5, 5, 6, 6, 7, and 7 are placed on the memory bus by the memory controller as part of the write operation labeled as 'Write 1', although only a subset of these bytes are illustrated in FIG. 7.

In the example of FIG. 7, the write window lines (710, 720) represent the window in which a DDR memory module reads data (i.e., the data being written to the DDR memory module) from a data bus running between the memory controller and the DDR memory module. The example of FIG. 7 depicts an embodiment in which BL8 read operations are executed, such that the DDR memory module reads eight bytes of data off of the data bus to complete a write operation. Therefore, the write windows are eight bytes in burst length.

In the example of FIG. 7, the write latency for the DDR system that the timing diagram of FIG. 7 corresponds to is three cycles. The write latency for the DDR system represents the number of cycles between the time at which a DDR memory module was signaled of a write operation and the time at which the DDR memory module begins reading data on a data bus in response to the write operation. In such an example, the DDR memory module begins reading data on a data bus for the purposes of writing such data to the DDR memory module.

In the example of FIG. 7, example 1 (700) depicts a perfectly timed write operation. In example 1 (700), a write operation, 'Write 1', is signaled to the DDR memory module and three cycles later the DDR memory module begins reading data on a data bus in response to the write operation, as a result of a write latency in the DDR system of three cycles as described above. In example 1 (700), the memory controller has begun data strobe signal pulsing and has also placed data on the data line three cycles after signaling the write command to the DDR memory module, thereby causing the DDR memory module to perfectly capture the data transmitted to the DDR memory module as part of write operation 'Write 1'. In such an example, the write adjust value is zero and there is no adjustment needed between the time at which the memory controller signals the DDR memory module of a write operation and the time at which the memory controller begins data strobe signal pulsing and placing data on the data bus.

In the example of FIG. 7, however, example 2 (701) depicts an imperfectly timed write operation. In example 2 (701), a write operation, 'Write 1', is signaled to the DDR memory module and three cycles later the DDR memory module begins reading data on a data bus in response to the write operation, as a result of a write latency in the DDR system of three cycles as described above. In example 2 (701), the memory controller has begun data strobe signal pulsing and has also placed data on the data line two cycles after signaling the write command to the DDR memory module, thereby causing the DDR memory module to miss capturing first two bytes of data associated with the write operation 'Write 1'. In such an example, the write adjust value is one and the time between signaling the DDR memory module of the one or more write operations and sending to the DDR memory module data associated with the write operation along with the data strobe signal should be increased by one cycle.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. Readers will understand that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for memory access alignment in a double data rate ('DDR') system, the apparatus comprising a computer processor, a computer memory operatively coupled to the computer processor, the computer memory having disposed within it computer program instructions that, when executed by the processor, cause the apparatus to carry out the steps of:
    executing, by a memory controller, one or more write operations to a predetermined address of a DDR memory module;
    executing, by the memory controller, a plurality of read operations from the predetermined address of the DDR memory module; and
    determining, by the memory controller, a read adjust value and a write adjust value in dependence upon the data captured in response to the read operations.

2. The apparatus of claim 1 wherein executing, by a memory controller, one or more write operations to a predetermined address of the DDR memory module further comprises:
    determining, by the memory controller, the burst length for the write operations, the burst length comprising the number of bytes that are to be written to an address in response to a single write command; and
    determining, by the memory controller, a number of write operations to execute in dependence upon the burst length.

3. The apparatus of claim 1 further comprising computer program instructions that, when executed by the processor, cause the apparatus to carry out the steps of:
    storing, by the memory controller, the read adjust value; and
    increasing, by the read adjust value, the number of cycles between signaling a subsequent read operation and capturing data from the subsequent read operation.

4. The apparatus of claim 1 further comprising computer program instructions that, when executed by the processor, cause the apparatus to carry out the steps of:
    storing, by the memory controller, the write adjust value; and
    increasing, by the write adjust value, the number of cycles between signaling the DDR memory module of a subsequent write operation and sending to the DDR memory module data associated with the subsequent write operation along with the data strobe signal.

5. The apparatus of claim 1 wherein the predetermined pattern is characterized by incrementally increasing numerical values.

6. The apparatus of claim 1 wherein:
executing, by a memory controller, one or more write operations to a predetermined address of a DDR memory module includes executing only a single write operation;
sending to the DDR memory module a predetermined amount of data of a predetermined pattern along with a data strobe signal includes sending two burst lengths of data; and
capturing data transmitted from the DDR memory module includes capturing only one burst length of data.

7. The apparatus of claim 1 wherein the predetermined pattern includes numerical values from 0 to 7 organized incrementally.

8. The apparatus of claim 1 wherein determining, by the memory controller, a read adjust value and a write adjust value in dependence upon the data captured in response to the read operations includes:
determining, whether a numerical value in a first unit of the captured data is greater than a numerical value in a second unit of the captured data;
responsive to determining that the numerical value in the first unit of the captured data is greater than the numerical value in the second unit of the captured data, setting the read adjust value to one and setting the write adjust value to the numerical value in the second unit of the captured data;
determining, whether the numerical value in a second unit of the captured data is greater than a numerical value in a third unit of the captured data;
responsive to determining that the numerical value in the second unit of the captured data is greater than the numerical value in the third unit of the captured data, setting the read adjust value to two and setting the write adjust value to the numerical value in the third unit of the captured data;
determining, whether the numerical value in a third unit of the captured data is greater than a numerical value in a fourth unit of the captured data; and
responsive to determining that the numerical value in the third unit of the captured data is greater than the numerical value in the fourth unit of the captured data, setting the read adjust value to three and setting the write adjust value to the numerical value in the fourth unit of the captured data, otherwise setting the read adjust value to zero and setting the write adjust value to the numerical value in the first unit of the captured data.

9. The apparatus of claim 1 wherein executing the one or more write operations to the predetermined address of the DDR memory module further comprises signaling the DDR memory module of the one or more write operations and sending to the DDR memory module a predetermined amount of data of a predetermined pattern along with a data strobe signal.

10. The apparatus of claim 1 wherein executing the plurality of read operations from the predetermined address of the DDR memory module further comprises signaling the DDR memory module of the read operations and capturing data transmitted from the DDR memory module.

11. The apparatus of claim 1 wherein the read adjust value comprises a number of cycles between signaling the read operations and capturing the data, and wherein the write adjust value comprises a number of cycles between signaling the DDR memory module of the one or more write operations and sending to the DDR memory module the predetermined amount of data of the predetermined pattern along with the data strobe signal.

* * * * *